United States Patent
Balasubramanian et al.

(10) Patent No.: US 7,349,285 B2
(45) Date of Patent: Mar. 25, 2008

(54) DUAL PORT MEMORY UNIT USING A SINGLE PORT MEMORY CORE

(75) Inventors: Suresh Balasubramanian, Coimbatore (IN); Lakshmikantha V Holla, Bangalore (IN); Bryan D Sheffield, Amherst McKinney, TX (US)

(73) Assignee: Texas Instruments Incorporated, Dallas, TX (US)

( * ) Notice: Subject to any disclaimer, the term of this patent is extended or adjusted under 35 U.S.C. 154(b) by 380 days.

(21) Appl. No.: 10/906,092

(22) Filed: Feb. 2, 2005

(65) Prior Publication Data

US 2006/0171239 A1    Aug. 3, 2006

(51) Int. Cl.
G11C 8/00    (2006.01)
G11C 8/18    (2006.01)
G11C 7/10    (2006.01)

(52) U.S. Cl. ............. 365/230.05; 365/233; 365/230.08
(58) Field of Classification Search ...................... None
See application file for complete search history.

(56) References Cited

U.S. PATENT DOCUMENTS

| | | | |
|---|---|---|---|
| 5,398,211 A * | 3/1995 | Willenz et al. | 365/230.05 |
| 5,781,480 A * | 7/1998 | Nogle et al. | 365/189.04 |
| 6,629,223 B2 * | 9/2003 | Bachot et al. | 711/167 |
| 2005/0270853 A1 * | 12/2005 | Chiang et al. | 365/189.05 |
| 2006/0098519 A1 * | 5/2006 | Kwon | 365/230.05 |

OTHER PUBLICATIONS

"Dual Port Ram", DS1609 from Dallas Semiconductor, pp. 1-7, Apr. 12, 2005.
S. K. Knapp, "XC4000 Series Edge-Triggered and Dual-Port RAM Capability", XAPP 065 Jul. 2, 1996 (Version 1.0), pp. 1-4, from Xilinx, Inc. San Jose, CA, U.S.A.
"Bank-Switchable Dual-Ports", Freqently Asked Questions, Application Note AN306, from IDT (Integrated Device Technology, Inc.)—Nov. 2003, pp. 1-5, Corporate Headquaters, Santa Clara CA.
Nick Sawyer and Marc Defossez, "Quad-Port Memories In Virtex Devices", Application Note: Virtex, Spartan-II, Spartan-IIE, Virtex-E, Virtex-II, Virtex-II Pro Familles, from www.xilinx.com, XAPP228 (v1.0) Sep. 24, 2002, pp. 1-5, Xilinx, Inc. San Jose, CA, U.S.A.
"Implementing Multi-Port Memories in Axcelerator Devices", Application Note, Jul. 2003, pp. 1-23 from http://www.actel.com, Actel Corporation, Sunnyvale, California.
"SR40 0.095—μm High—Speed Copper Standard cell/Gate Array ASIC", Mar. 4, 2002, pp. 1-20 from http://www.ti.com/sc/docs/asic/prodinfo.htm: Texas Instruments Manual.
Viekko Koivumaa, "Implementing Shared Memory Interface with a TMS320C54x DSP", Application Report SPRA505, Digital Signal Processing Solutions, Dec. 1998, pp. 1-8. from Texas Instruments.
"Dual Port Ram", DS1609 from Dallas Semiconductor, pp. 1-7.

\* cited by examiner

Primary Examiner—Huan Hoang
Assistant Examiner—Michael Weinberg
(74) Attorney, Agent, or Firm—Alan K. Stewart; W. James Brady; Frederick J. Telecky, Jr.

(57) ABSTRACT

A dual port memory implemented using a single port memory core. In an embodiment, the access requests from the two ports are processed in a single memory clock cycle. In one implementation, the access request corresponding to the first port is processed in the high logic state of the memory clock cycle, and the access request corresponding to the second port is processed in the low logic state of the memory clock cycle. A single port memory core may provide multiple memory enable signals and corresponding strobe signals, with each combination of memory enable signal and strobe signal facilitating the memory access request from a corresponding port. An alternative embodiment uses the duration of each clock cycle of the memory clock signal more efficiently by starting the second memory access soon after completion of the first memory access (without waiting for the logic low of memory clock signal).

16 Claims, 5 Drawing Sheets

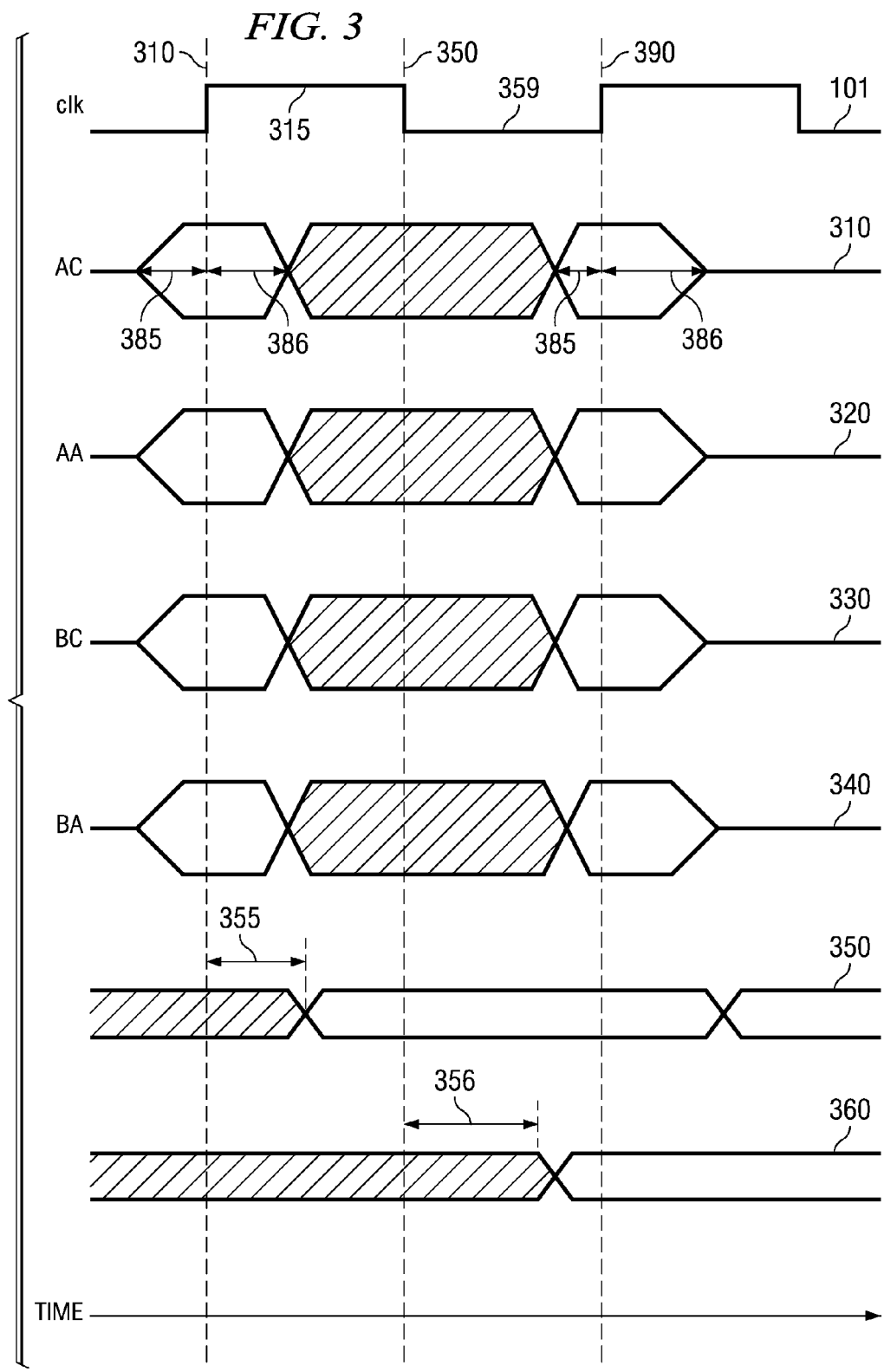

DUAL PORT MEMORY UNIT USING A SINGLE PORT MEMORY CORE

BACKGROUND OF THE INVENTION

1. Field of the Invention

The present invention relates to the design of memory units used for storing data bits, and more specifically to a dual port memory unit implemented using a single port memory core.

2. Related Art

A memory subsystem generally contains multiple cells, with each cell storing a data bit (typically of binary value). Memory subsystems are implemented using technologies such as SRAMs (static random access memories) and DRAM (dynamic RAMs), as is well known in the relevant arts.

Access ports are often provided (in memory subsystems) to facilitate storing or retrieving the data bits in the cells. Access ports generally contains number of leads which can be connected to external devices accessing the memory subsystem. The leads in turn are typically connected to carry control signals, address information and data to perform memory related operations such as read, write, etc.

There are several prior memory subsystems, which are designed with only a single access port. In such an approach, all external systems accessing a memory subsystem share the same single access port for accessing the data in the cells contained in the memory subsystem. One problem with such single port memory subsystems is that only one access operation can be issued to the memory subsystem in a given memory clock cycle, and accordingly a sequential order is imposed on access operations when multiple devices need to access the data in such a memory subsystem.

At least to provide simultaneous access to multiple devices (in a given memory cycle), dual port or multi port subsystems are often used. In general, an access operation can be issued at each of the such multi-ports independently. Thus, each external device may issue a corresponding access operation independently (to a corresponding port) without regard to some other device issuing access operations to some other port. The effective aggregate access rate of the memory subsystem (and thus the throughput performance of a system employing the memory subsystem) may be enhanced as a result.

In one prior approach, dual port memories are implemented by employing dual-port bit cells, with each cell supporting parallel access operations corresponding to the two ports. Thus, even if the two read accesses (from two different ports) are directed to the same cell, the cell is designed to provide the stored bit value on paths corresponding to the two ports in parallel.

One problem with such an approach based on dual-port bit cells is that each dual-port cell may require more transistors than a bit-cell ("single port bit cell") supporting only single access at any given time. For example, accordingly to one approach, a dual port cell and a single port cell respectively require 8 and 6 transistors. The enhanced number of transistors generally leads to higher area requirements, more power consumption, and additional complexity to overall implementation. Further, in one known embodiment, the dual port cell cannot support write operations (as well as combination of one write and one read) from both ports in the same memory cycle.

Accordingly, what is needed is a dual-port memory subsystem which overcomes at least some of such disadvantages.

BRIEF SUMMARY OF THE INVENTION

A dual port memory subsystem processes access requests received on multiple ports using a single port memory core. A port handler receives the access requests on corresponding ports, and interfaces with the single port memory core to perform the access requests one after the other.

BRIEF DESCRIPTION OF THE DRAWINGS

The present invention will be described with reference to the following accompanying drawings.

FIG. 3 is a timing diagram illustrating the timing relationships of various signals in providing a $dual_{13}port$ memory subsystem using a single port memory core in an embodiment of the present invention.

In the drawings, like reference numbers generally indicate identical, functionally similar, and/or structurally similar elements. The drawing in which an element first appears is indicated by the leftmost digit(s) in the corresponding reference number.

DETAILED DESCRIPTION

1. Overview

Figure 1:
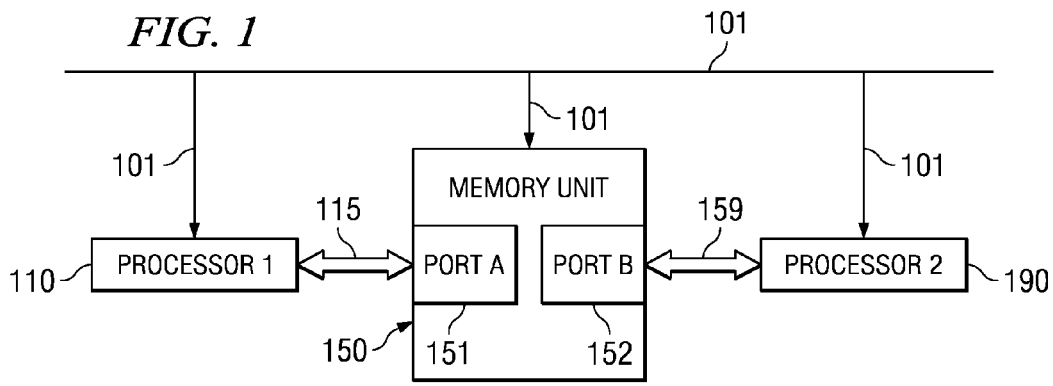
FIG. 1 is a block diagram illustrating the details of an example system in which several features of the present invention can be implemented.

A dual port memory subsystem provided according to an aspect of the present invention processes access requests received on multiple ports using a single port memory core. A port handler receives the access requests on corresponding ports, and interfaces with the single port memory core to perform the access requests one after the other. In an embodiment, the access requests received on the two ports are performed in a single memory clock cycle, wherein the memory clock represents a clock signal used for interfacing with the memory subsystem.

Due to the use of the single port memory core, the complexity of implementation of the core is reduced (compared to the dual port cells of the prior art system, noted above in the background section). For example, each single port cell can be implemented using only six transistors (compared to eight cells in the dual-port bit cells, noted above), thereby reducing the area and power consumption requirements. By providing a dual port memory subsystem, two external devices can issue memory access requests in parallel, thereby potentially enhancing the throughput performance of the external devices.

According to another aspects of the present invention, each access request can be either a read operation or a write operation, irrespective of whether the access request on the other port is a read or write operation. That is, both the access requests can potentially be write operations to the same (single port) bit cell in the single port memory core.

Another aspect of present invention uses a single port memory supporting multiple strobe signals to provide access to multiple ports. Each strobe signal initiates a memory access corresponding to an access request defined by the signal levels on the corresponding signal lines. Thus, a first strobe signal is asserted to perform the first memory access and a second strobe signal is asserted after completion of the first memory access.

In one embodiment, the first and second strobes are respectively asserted in high and low logic levels of the memory clock signal (defining the memory cycles). In such an embodiment, the access request from a first port is processed during the logic high state of the memory clock signal and the access request from the second port is processed during the other (low) state.

In another embodiment, the second strobe signal is asserted to initiate the second memory access soon after completion of the first memory access. The approach thus is independent of the duty cycle (ratio of time duration of logic high and that of logic low) of the memory clock cycle, and the frequency of the memory clock can be accordingly enhanced.

Several aspects of the invention are described below with reference to examples for illustration. It should be understood that numerous specific details, relationships, and methods are set forth to provide a full understanding of the invention. One skilled in the relevant art, however, will readily recognize that the invention can be practiced without one or more of the specific details, or with other methods, etc. In other instances, well known structures or operations are not shown in detail to avoid obscuring the features of the invention.

2. Example System

FIG. 1 is a block diagram illustrating the details of an example system in which several features of the present invention can be implemented. The system is shown containing memory subsystem 150, two access ports 151 and 152, and processors 110 and 190. Each component is described below in further detail.

Processors 110 and 190 represent external devices, which issue access requests independently on ports 151 and 152 respectively. Both the access requests are timed according to a common memory clock 101, as shown.

Dual port memory subsystem 150 receives access requests on ports 151 (via bus 115) and 152 (via bus 159), and performs the corresponding access operations (read, write, etc.). In general, each port contains a set of terminals to carry control signals, address information and data as required for the corresponding memory operation.

Various aspects of the present invention enable dual port memory subsystem 150 to perform the access operations in a single clock cycle of memory clock 101 using a single port memory core, as described below in further detail.

3. Dual Port Memory Implemented Using Single Port Memory Core

Figure 2:
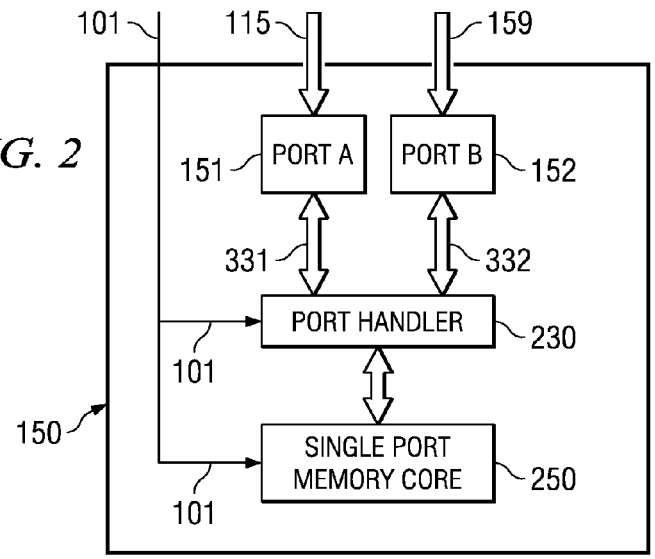
FIG. 2 is a block diagram illustrating the details of dual port memory subsystem in one embodiment.

FIG. 2 is a block diagram illustrating the details of dual port memory subsystem 150 in one embodiment. Dual port memory subsystem 150 is shown containing port handler 230 and single port memory core 250, in addition to port A 151 and port B 152. Each component is described bellow in further detail.

Single port memory core 250 contains only a single port, and thus performs memory related operations on a single set of control signals, address information and data.

Port handler 230 receives access requests from port A 151 and port B 152 through paths 331 and 332 respectively, and performs the corresponding memory operations sequentially by interfacing with single port memory core 250. The memory operations corresponding to both ports 151 and 152 may be performed in a single cycle of clock signal 101. According to an aspect of the present invention, both the access requests may correspond to write operations.

In general, port handler 230 and single port memory core 250 need to be implemented with mutually cooperative interfaces to provide various features of the present invention. Various embodiments can be implemented consistent with such a requirement, as described below with respect to various example embodiment. First, the general operation in an embodiment is described with respect to FIGS. 3 and 4 below.

4. Operation of Port Handler and Single Port Memory Core in One Embodiment

FIG. 3 is a timing diagram illustrating the timing relationships of various signals in providing a dual-port memory subsystem using a single port memory core in an embodiment of the present invention. The timing diagram is shown for read operations of both the devices A and B for the purpose of illustration. However, the concepts can be extended to combinations of read and write operations, as will be apparent to one skilled in the relevant arts by reading the disclosure provided herein.

Signals received from device A received on port A 151 are shown as control signal (AC) 310 and address (AA) 320. Signals received from device B received on port B are shown as control signal (BC) 330 and address (BA) 340. Results of the read operations on port A and port B are respectively represented by data signals 350 and 360.

Memory clock signal 101 is shown with rising edge at time point 310, falling edge at time point 350, level 1 315, and level 2 359, all within one clock cycle. Level 2 359 is shown ending at time point 390 corresponding to the rising edge.

Port A and port B are shown presenting control signals and address value on the respective terminals starting a time duration 385 (representing a setup time $t_{su}$) prior to the rising edge 110 of the clock 101 and holds data for a time duration 386 (representing hold time $t_h$). Port handler 230 is shown latching various memory signals on occurrence of rising edge 310. During level 1 of the clock 101, memory access corresponding to port A is performed and data (read operation) is presented on the data terminal of the port A after a time duration 355 representing access time (within the duration of level 1 315 shown on data signal 350 corresponding to port A).

During level 2 359 (between falling edge 150 and rising edge 190) of memory clock 101, memory access corresponding to port B is performed and data (read operation) is presented on the data terminal of the port B (as shown by 360) after a time duration 356 representing access time for port B, hence completing both accesses within one clock cycle of memory clock 101.

Figure 4:
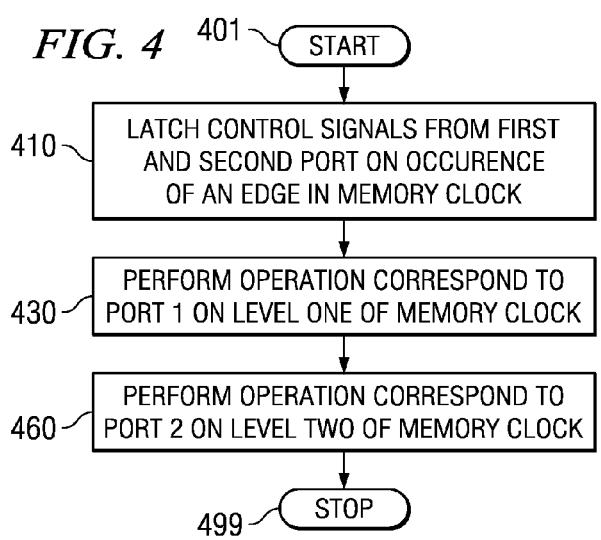
FIG. 4 is a flow chart summarizes the operation of a dual port memory in one embodiment.

The flow-chart of FIG. 4 summarizes the above operation. The description is provided with reference to FIGS. 1-3 above, merely for illustration. However, the flow-chart can be implemented in other environments as well. The flow-chart begins in step 401, in which control immediately passes to step 410.

In step 410, control signals from port A and port B are latched on occurrence of an edge on clock 101. Even though the rising edge is shown used for latching in FIG. 3, the falling edge can be used in alternative embodiments. Various latching and edge detection techniques well known in the relevant art can be used for such a purpose.

In step 430, memory access corresponding to port 1 is performed on level 1 of Clock 101. Depending upon the transition used in step 1, level 1 can be high or low (even though shown as logic high in FIG. 3).

In step 460, memory access corresponding to port 2 is performed on level 2 of clock 101. The method ends in step 499.

Thus, dual-port memory subsystems can be provided using single-port memory in accordance with the approaches such as those described above. The approaches can be implemented using various architectures. An example architecture is described below in further detail.

5. Example Architecture

Figure 5:
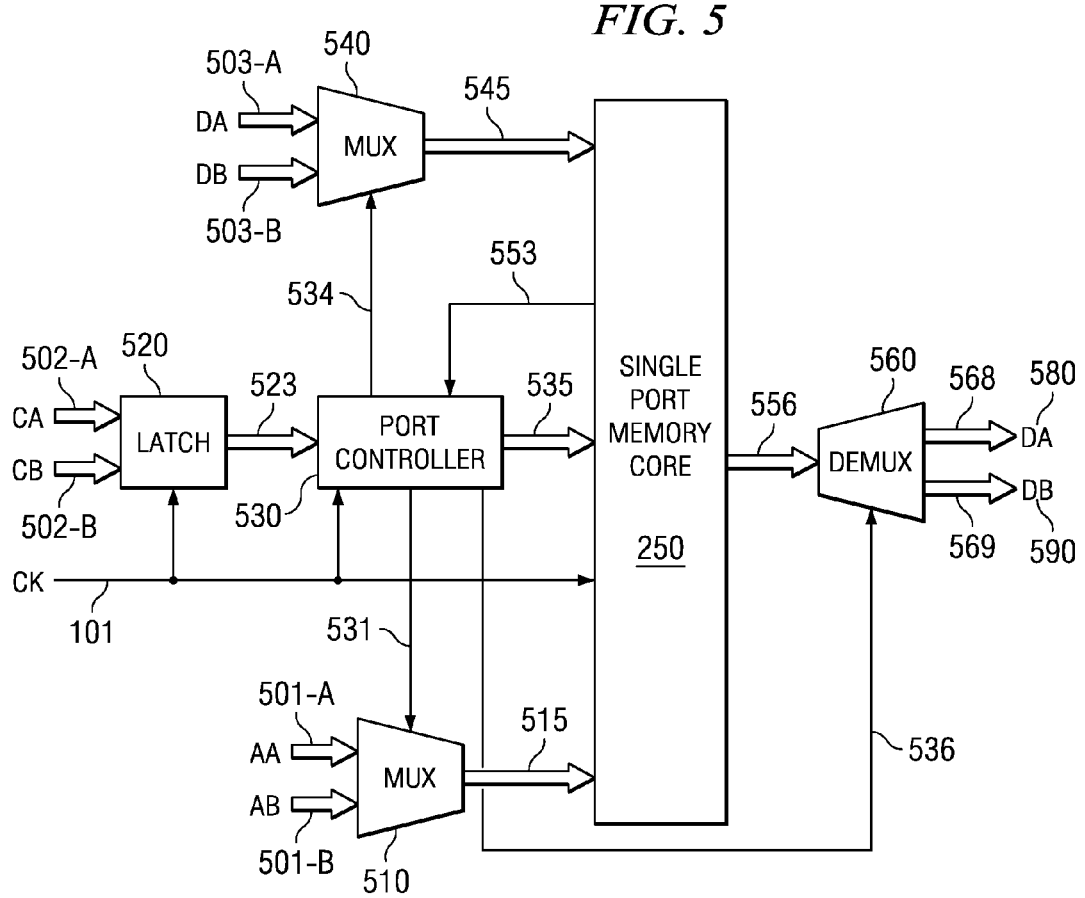
FIG. 5 is a block diagram illustrating the details of an example architecture implementing dual port memory subsystem using single port memory core in an embodiment of the present invention.

FIG. 5 is a block diagram illustrating the details of an example architecture implementing dual port memory subsystem using single port memory core according to various aspects of present invention. The block diagram further illustrates the manner in which port handler 230 can be implemented.

The architecture of FIG. 5 is shown containing single port memory core 250, latch 520, multiplexers (Mux) 510 and 540, port controller 530, demultiplexer (Demux) 560. Latch 520, multiplexer 510, port controller 530, and demultiplexer 560 together form port handler 230 in one embodiment. Port A 151 is logically viewed as containing address lines AA 501-A, data output lines DOA 568, data input lines DIA 503-A, and control signal CA 502-A, port B 152 is logically viewed as containing address lines AB 501-B, data output lines DOB 569, data input lines DIB 503-B, and control signals CB 502-B. Each component is described bellow in further detail.

Single port memory core 250 receives control signals on path 535, address on path 515, data input on path 545 (in case of write operation) and memory clock signal 101, and performs the access operation specified by the control signal. The status signals corresponding to the operation are provided on path 553. In case of a read operation, single port memory core 250 sends data on path 556.

Latch 520 latches control signals CA 502-A and CB 502-B on the rising edge of memory clock signal 101, and provides the latched signals on output path 523. The control signals may indicate whether an access operation is being issued on each of the ports, whether the operation on each port corresponds to a read operation or a write operation, etc. As noted above, the latching operation can be performed on falling edge of memory clock 101.

Multiplexer(Mux) 510 selects one of signals AA 501-A and AB 501-B according to a select value received on path 531, and provides the selected value on path 515. Due to the operation of port controller 530, the select value causes multiplexer 510 to select AA 501-A (address lines of port A 151) in the high level of the memory clock cycle (of signal 101), and AB 501-B during the low level of the memory clock cycle (if there is a corresponding access operation to be performed).

Similarly, multiplexer 540 operates to select DIA 503-A during the high level of the memory clock cycle, and DIB 503-B during the low level when a write operation is being performed under the control of select signal 534.

De-multiplexer(Demux) 560 receives signals from single port memory core 250 on path 556 and presents the received signal on one of the output path DOA 568 and DOB 569 based on the control input received from decoder 530 on path 536. Demultiplexer 560 is operational during the read access operations.

Port controller 530 generates various control signals to facilitate sequential access to single port memory core 250. Control signals generated by decoder 530 include access control signals for single port memory core (compatible with the interface requirements of single port memory core being used), multiplexers 510 and 540, and demultiplexer 560. The output of latch 520 on path 523, memory clock signal 101, and status signals (indicating status of memory operation) on path 553 may be used in generating the control signals. The control signals generated are described below in further detail.

With respect to multiplexer 510, select line 531 is generated to cause selection of address AA 501-A (in the high logic state of the memory clock cycle of memory clock signal 101) if the control signals on path 523 indicate the presence of either a read of write request from port-A. Select line 531 is generated to cause selection of address AB 501-B (in the low logic state of the memory clock cycle of memory clock signal 101) if the control signals on path 523 indicate the presence of either a read of write request from port-B.

With respect to multiplexer 540, select line 534 is generated to cause selection of input data DIA 503-A (in the high logic state of the memory clock cycle of memory clock signal 101) if the control signals on path 523 indicate the presence of write request from port-A. Select line 534 is generated to cause selection of input data DIB 503-B (in the low logic state of the memory clock cycle of memory clock signal 101) if the control signals on path 523 indicate the presence of write request from port-B.

With respect to de-multiplexer 560, (in the logic high state of memory clock signal 101) select line 536 is generated to cause the output to be provided on path 568 (part of port A 151) if the control signals on path 523 indicate the presence of a read operation and the status signal on path 552 indicates the completion of the read operation. Select line 536 is generated (in logic low state of memory clock signal 101) to cause the output to be provided on path 569 (part of port B 152) if the control signals on path 523 indicate the presence of a read operation and the status signal on path 552 indicates the completion of the read operation.

The control signals generated by port controller 530 (to single port memory core 250) depend on the interface requirements of the core 250. An example interface requirements and the corresponding control signals generated are described below with respect to FIG. 6.

6. Detailed Implementation

Figure 6:
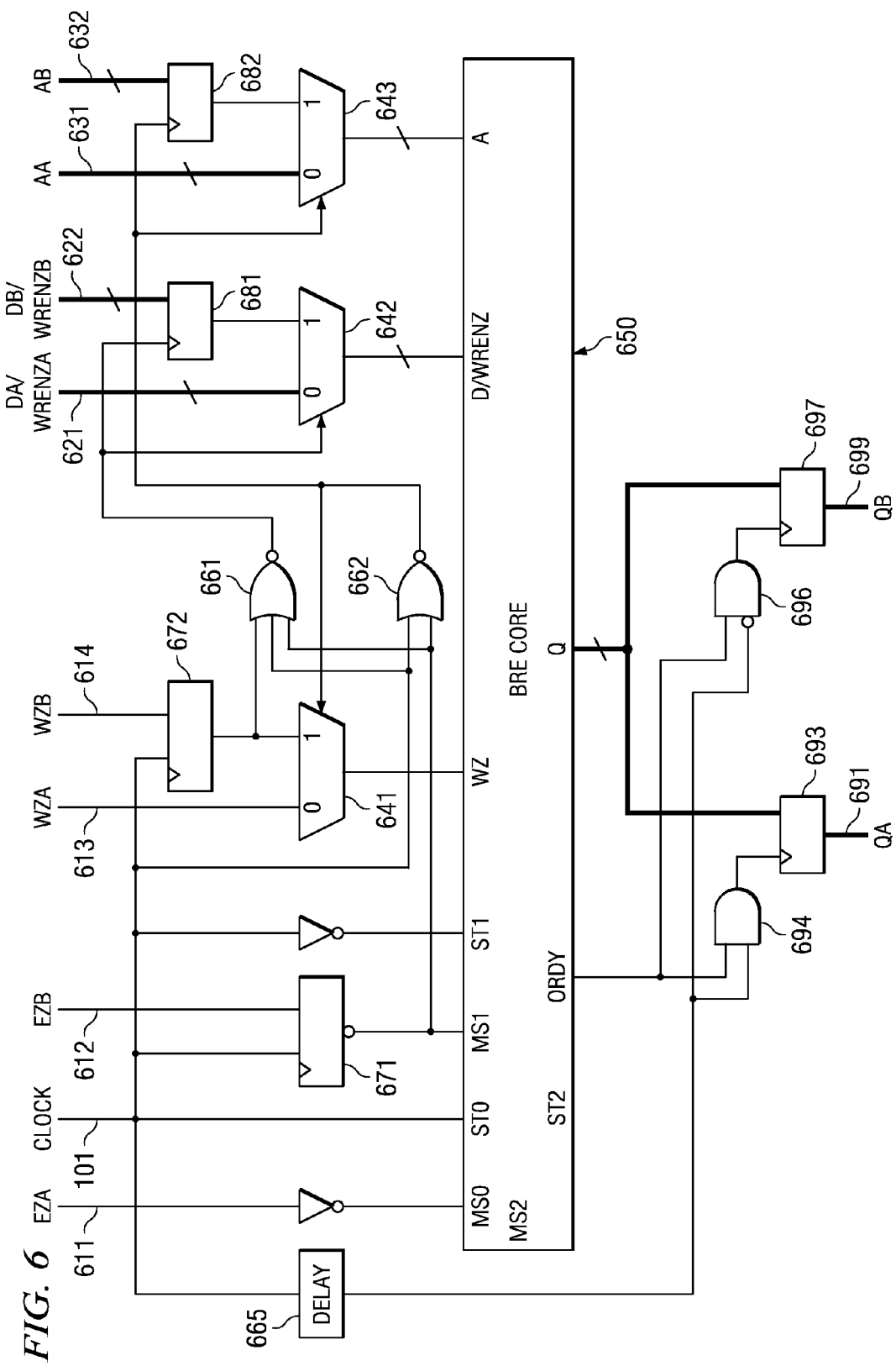
FIG. 6 is a circuit diagram illustrating the implementation of an embodiment of a port handler in further detail.

FIG. 6 is a circuit diagram illustrating the implementation of an embodiment of port handler 230 in further detail. The diagram is shown containing latches 671 and 672, multiplexers 641-643, flip-flops (or registers in case of multiple bits are stored) 681, 682, 693 and 697, inverters 651 and 652, NOR gates 661-662, and AND gates 694 and 696, and delay circuit 665, in addition to single port memory core 650. Only the components as necessary for a general understanding of the operation of the embodiment are included in the Figure. However, it should be appreciated that various other elements (e.g., to control delays and buffering on various paths) may also be included, as suitable in the specific environment.

In addition, components (other than single port memory core 650) are designed compatible with the interface requirements of single port memory core 650. Accordingly, the various signals defining the interface requirements of single port memory core 650 are described below first.

Single port memory core 650 is shown connected to a read /write control signal WZ, a data bus D/WRENZ, a address bus A, a output bus Q, a status control signal ORDY, three memory select signals MS0, MS1, and MS2, and three strobe signals ST0, ST1, and ST2.

A logical low on read/write control signal WZ indicates that the present memory access is for a write operation, and a logic high indicates that the memory access is for a read operation.

D/WRENZ bus contains both data lines D and write control lines WRENZ. Data line D contains a number of bits equal to the width (number of bits in each memory location) of single port memory core 650. Write control line WRENZ contains number of bits equal to number of bits carried by data lines D. The value of the write control bit determines whether a corresponding data bit can be written to memory. As an example if all bits of the WRENZ are zero then all the data bits are written to memory.

Address bus A receives the address of memory location being accessed. Q represents an output bus carrying the bits retrieved due to a read operation. ORDY is an output signal which is raised to a high logic level to indicate the output on Q-bus is stable (i.e., completion of a read operation). Thus, a low level on ORDY indicates the progress of a read operation, and thus the value on Q-bus is not yet stable.

Logic high on any of memory select signal MS0, MS1, MS2 enables a memory access. Thus, no memory access may be performed if a logic low is present on all memory select signals.

A rising edge on any strobe signals ST0, ST1, and ST2, when the corresponding memory select signal is at logic high, initiates memory access. Thus, the memory select signal is first asserted (to logic high), and then the corresponding strobe signal is generated to initiate the corresponding memory access.

As described below, the memory select and strobe signals are used to provide dual port access using single port memory core 650. First, various control and data signals received for each of the ports are described. The manner in which various control and data signals consistent with the interface requirements of single port memory core 650 are generated from the control and data signals received for the ports, is then described.

With respect to the control and data signals received for each port, the input signals to port handler 230 from port A 151 include enable signal EZA 611, read/write control WZA 613, data bus DA/WRENZA 621, address bus AA 631. The output signals generated to port A 151 include QA691. The input signals to port handler 230 from port B 152 include enable signal EZB 612, read/write control WZB 614, data bus DB/WRENZB 622, and address bus AB 632. The output signals generated to port B 152 include QA699. The two ports are shown sharing common clock 101. Each of the signals is described below in further detail.

A logic low on memory enable signal EZA 611 requests memory access to port A. Similarly, a logic low on memory enable signal EZB 612 requests memory access to port B. A logic low on EZA 611 and EZB 612 disables memory access to port A and port B respectively. It may thus be appreciated that EZA and EZB respectively indicate the arrival of the access requests on the respective ports. According to an aspect of the present invention, the two signals can be received simultaneously (at the same time instance), and yet the access requests are processed in the same clock cycle of memory clock signal 101.

A logic low on read/write control signal WZA 613 indicates present memory access by port A is for performing write operation and a logic high indicates request for performing read operation. Similarly, a logic low on read/write control signal WZB 614 indicates present memory access by port B is for performing write operation and a logic high indicates request for performing read operation.

Each of DA/WRENZA 621 and DB/WRENZB 622 buses represents either write control signal if bit write feature is enabled or represents data bits if bit write feature is disabled, for port A and port B respectively. Address bus AA 631 and AB 632 respectively carry the address bits of memory location for port A and port B. QA 691 and QB 699 represents an output bus carrying the bits retrieved due to a read operation corresponding to port A and port B respectively. Memory clock CLK 101 provides a common timing reference to port A and port B.

The description is now continued with respect to the manner in which various components operate to generate the various control and data signals consistent with the interface requirements of single port memory core 650 from the control and data signals received from the ports.

Inverter 651 inverts memory select EZA 611 (of port A 151) and presents inverted signal to memory select MS0. As may be appreciated, when memory select for port A EZA 611 is at logic high, memory access is enabled for port A. Memory clock signal 101 is connected to strobe ST0, hence occurrence of a rising edge of memory clock signal 101 initiates memory access for port A when memory access for port A is enabled.

Latch 671 and inverter 652 operate to initiate access requests received on port B 152 in the second half of memory clock signal 101. In particular, latch 671 latches the memory select EZB 612 on the rising edge of clock 101 and the inverted (due to the bubble, shown) output is presented as MS1 immediately. Inverter 652 inverts clock signal 101 and presents the inverted clock signal to ST1 input signal. As a result, a memory access corresponding to port B 152 is initiated at the falling of clock signal 101 (even though the memory select MS1 is asserted at the rising edge earlier).

NOR gate 662 performs a logical NOR operation of the output of latch 671 and memory clock 101, and presents the resulting output as select signals for multiplexers 641 and 643, as well as clock signal to D flip-flop 682. It may be appreciated that the output of NOR gate 662 is at 0 in the first half of memory clock signal 101, and at 1 in the second half of memory clock signal 101 only if EZB 612 is at 1. Hence NOR gate 662 effectively operates as gate to the port B address signals.

Latch 672 latches read-write control WZB 614 on rising edge of memory clock signal 101 and presents the latched value as an input signal to multiplexer 641. NOR gate 661 performs a logical NOR operation of the outputs of latch 671-672 and memory clock 101, and presents the resulting output as select signal to multiplexer 642 and as clock input to D flip-flop 681. As a result, the output of NOR gate 661 is at 0 in the first half of memory clock signal 101, and at logic 1 in the second half of memory clock signal 101 only if both of EZB 612 and WZB are asserted.

Multiplexer 641 selects read write control signals of either port A or port B (i.e., 61 3 or 614) under the control of select signal received from NOR gate 662. As a result, multiplexer 641 selects WZA 613 in the first half of clock signal 101, and WZB 614 in the second half of clock signal 101 if EZB 612 is at 1.

D flip-flop 681 latches WRENZB 622 on rising edge of the output of NOR gate 661, and presents the latched value as an input signal to multiplexer 642. D flip-flop 682 latches address AB 632 on rising edge of output of NOR gate 662 and presents the latched value as an input signal to multiplexer 643.

Multiplexer 642 selects WRENZA 621 or WRENZB 622 (output of D flip-flop 681) according to the value of output of NOR gate 661. As a result, WRENZA 621 is selected when memory clock signal 101 is at logic 1 and WRENZB 622 is selected when memory clock signal 101 is at logic 0 and EZB 612 and WZB 614 are asserted.

Multiplexer 643 selects AA 631 or AB 632 (output of D flip-flop 682) according to the value of output of NOR gate 662. As a result, AA 631 is selected when memory clock signal 101 is at logic 1 and AB 622 is selected when memory clock signal 101 is at logic 0 and EZB 612 is asserted.

From the above, it may be appreciated that memory access requests from port A are presented during the logic high state of memory clock signal 101, and access requests from port B are presented during the logic low state of memory clock signal 101. The manner in which port handler 230 may process the output signals from single port memory core 650, is described below.

AND gate 694 and flip-flop 693 operate to latch the Q output of single port memory core 650 when memory clock signal 101 is at logic high and when ORDY transition from low to high. Accordingly, as shown, AND gate 694 receives (delayed) memory clock signal 101 and ORDY, and the resulting output is connected as clock input of D flip-flop 693. Similarly, AND gate 696 and flip-flop 697 operate to latch the Q output of single port memory core 650 when memory clock signal 101 is at logic low and when ORDY transition from low to high.

From the above, it may be appreciated that port A memory accesses are performed during the logic high of memory clock signal 101, and port B memory accesses are performed during the logic low of the clock signal 101.

One problem with the above approach is that the entire time duration within each cycle of memory clock signal 101 may not be fully utilized, for example, if the first memory access can be performed in a shorter duration than the duration of logic high of memory clock signal 101. Another problem with the above approach is that a minimum duration may be required in each of the high and low logic states of memory clock signal 101, thereby forcing constraints on the duty cycle of memory clock signal 101. Such constraints may be undesirable, for example, in satisfying some other design requirements. An alternative approach overcomes some of such problems as described below.

7. Alternative Approach

Figure 7:
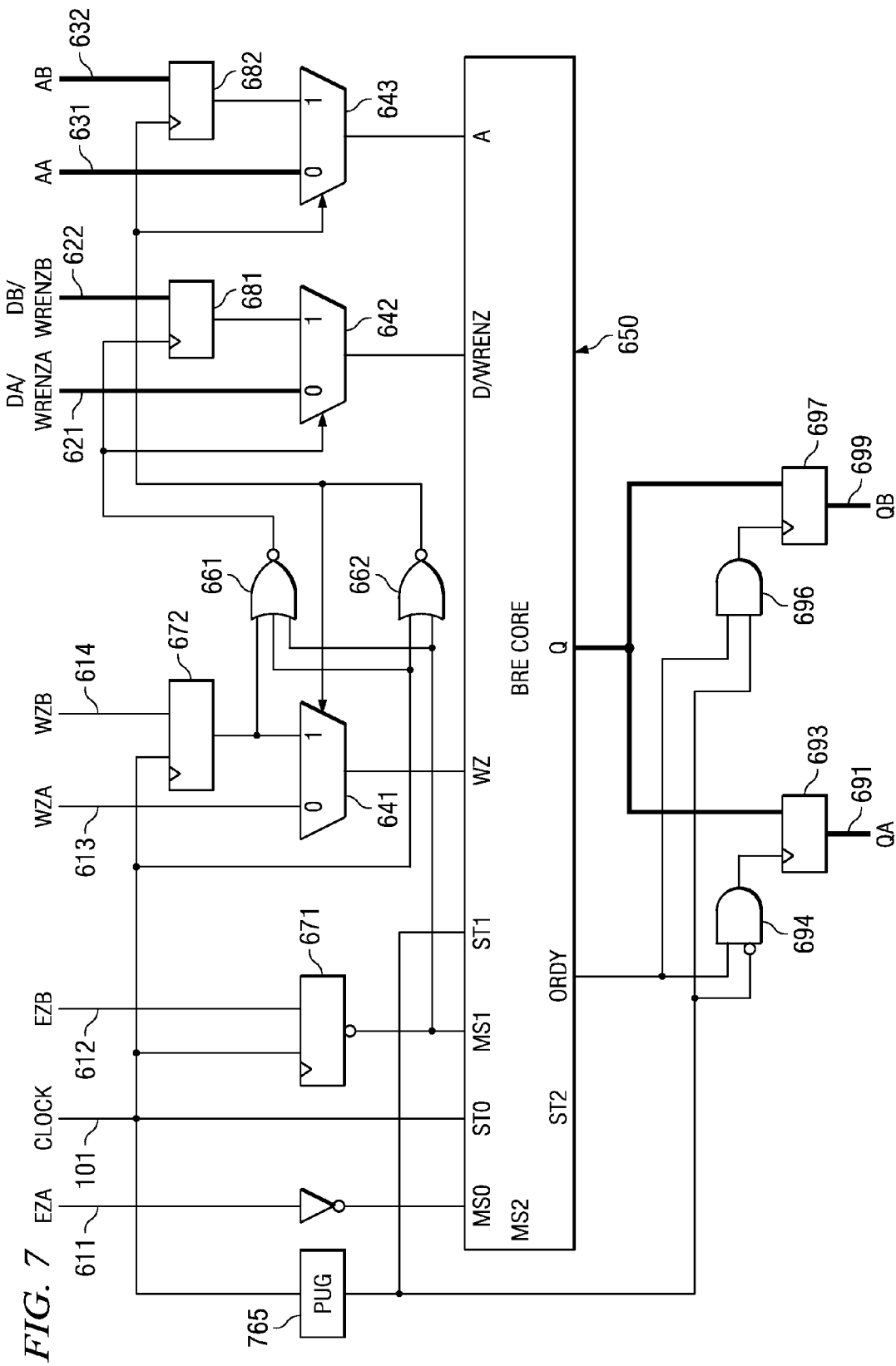
FIG. 7 is a block diagram illustrating the details of an alternative embodiment of port handler.

FIG. 7 is a block diagram illustrating the details of an alternative embodiment of port handler 230. Only the differences of the embodiment of FIG. 7 compared to the details of FIG. 6 are described for conciseness. Similar components (even if operated differently) are shown with similar reference numerals, again for conciseness.

In comparison to FIG. 6, pulse generator (PUG) 769 is shown in addition. PUG 769 receives memory clock signal 101 and generates a strobe signal ST1, which is delayed by a desired magnitude in relation to the rising edge of memory clock signal 101. The delay needs to allow for completion of access operation corresponding to port A. In addition, the strobe signal needs to continue at a high level for sufficient time to allow completion of access operation on port B signal, as will be clearer from the description below.

AND gate 694 receives the inverted output of PUG 765 and ORDY from single port memory core 650. The output of AND gate 694 is provided as a clock signal to flip-flop 693. As a result, the output Q is latched and provided on QA 691 when ORDY transitions from logic low to high (during the logic low of PUG output). Similarly, the combination of AND gate 696 and flip-flop 697 latches and provides the output Q on QB 699 when PUG output is high and when ORDY transitions to logic high.

Since the second memory access does not depend on the low logic level of memory clock signal 101, flexibility may be available in choosing the duty cycle of memory clock signal 101. In addition, the access operation corresponding to port B can potentially be initiated ahead of the transition to logic low of memory clock signal 101, thereby potentially enhancing the aggregate throughput performance of the memory subsystem.

8. Conclusion

While various embodiments of the present invention have been described above, it should be understood that they have been presented by way of example only, and not limitation. Thus, the breadth and scope of the present invention should not be limited by any of the above_described exemplary embodiments, but should be defined only in accordance with the following claims and their equivalents.

What is claimed is:

1. A system comprising:
    a first processor issuing a first memory access request;
    a second processor issuing a second memory access request; and
    a dual port memory comprising:
        a first port and a second port respectively receiving said first memory access request and said second memory access request, wherein said first memory access request and said second memory access request are processed in a single memory cycle;
        a single port memory core;
        a port handler interfacing with said single port memory core to perform said first memory access request and then said second memory access request, wherein said port handler comprises:
            a first multiplexer coupling a first access address and then a second access address to said single port memory, wherein said first access address and said second access address respectively specify locations in said single port memory core where a corresponding memory access request is to be performed;
            a first flip-flop latching said second access address, wherein an output of said first flip- flop is connected as one input of said first multiplexer; and
            wherein said first flip-flop latches said second access address in response to a memory clock signal at a first logic level and an enable signal indicating that said second memory access request is available on said second port.

2. The system of claim 1, wherein said first multiplexer selects said first access address when said memory clock signal is at a second logic level, and selects said second access address when said memory clock signal is at said first logic level and said enable signal indicates that said second memory access request is available on said second port.

3. The system of claim 1, wherein the port handler further comprises:
    a second multiplexer coupling a first data value and then a second data value to said single port memory, wherein said first data value and said second data value respectively specify the values to be written into said single port memory core.

4. The system of claim 3, wherein said port handler further comprises:
    a second flip-flop latching said second data value, wherein an output of said second flip-flop is connected as one input of said second multiplexer.

5. The system of claim 4, wherein said second flip-flop latches said second data value when the memory clock signal is at logic low, an enable signal indicates that said second memory access request is available on said second port and that said second access request is for a write operation.

6. The system of claim 5, wherein said second multiplexer selects said first data value when said memory clock signal is at logic high, and selects said second data value when said memory clock signal is at logic low, said enable signal indicates that said second memory access request is available on said second port and that said second access request is for a write operation.

7. The system of claim 3, wherein said port handler further comprises:
a third multiplexer coupling a first read/write control signal and then a second read/write control signal to said single port memory, wherein said first read/write control signal and said second read/write control signal respectively specify whether the corresponding memory access request is a read operation or a write operation.

8. The system of claim 7, wherein said port handler further comprises:
a third flip-flop latching said second read/write control signal, wherein an output of said third flip-flop is connected as one input of said third multiplexer.

9. The system of claim 8, wherein said third flip-flop latches said second read/write control signal on a rising edge of the memory clock signal.

10. The system of claim 9, wherein said third multiplexer selects said first read/write control signal when said memory clock signal is at logic high, and selects said second read/write control signal when said memory clock signal is at logic low, and said enable signal indicates that said second memory access request is available on said second port.

11. The system of claim 7, wherein said single port memory core contains a first memory select input signal, a second memory select input signal, a first strobe signal and a second strobe signal, said port handler asserting said first memory select input signal upon receiving a first memory enable signal and asserting said second memory select input signal upon receiving a second memory enable signal, said port handler asserting said first strobe signal to initiate said first access request and then said second strobe signal to initiate said second access request.

12. The system of claim 11, wherein said first strobe signal is generated in one logic level of said memory clock signal and said second strobe signal is generated in another logic level of said memory clock signal.

13. The system of claim 11, wherein said first strobe signal is generated on occurrence of an edge of the memory clock signal and said second strobe signal is generated after completion of said first memory access request.

14. A dual port memory comprising:
a first port and a second port respectively receiving a first write access request and a second write access request, wherein said first write access request and said second write access request are processed in a single memory cycle;
a single port memory core;
a port handler interfacing with said single port memory core to perform said first write access request and said second write access request, wherein said port handler comprises:
a first multiplexer coupling a first access address and then a second access address to said single port memory, wherein said first access address and said second access address respectively specify locations in said single port memory core where a corresponding write access request is to be performed;
a first flip-flop latching said second access address, wherein an output of said first flip-flop is connected as one input of said first multiplexer; and
wherein said first flip-flop latches said second access address in response to a memory clock signal at a first logic level and an enable signal indicating that said second write access request is available on said second port.

15. The dual port memory of claim 14, wherein said first write access and said second write access are received simultaneously.

16. The dual port memory of claim 15, wherein said port handler performs said first write access request and then said second write access request after completion of said first write access request.

* * * * *